(12) United States Patent
Abraham et al.

(10) Patent No.: US 10,157,842 B1
(45) Date of Patent: Dec. 18, 2018

(54) SEMICONDUCTOR DEVICE INCLUDING SUPERCONDUCTING METAL THROUGH-SILICON-VIAS AND METHOD OF MANUFACTURING THE SAME

(71) Applicant: INTERNATIONAL BUSINESS MACHINES CORPORATION, Armonk, NY (US)

(72) Inventors: David W. Abraham, Croton, NY (US); John M. Cotte, New Fairfield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/609,860

(22) Filed: May 31, 2017

(51) Int. Cl.
*H01L 21/28* (2006.01)
*H01L 21/32* (2006.01)
(Continued)

(52) U.S. Cl.
CPC .. *H01L 23/53285* (2013.01); *H01L 21/02068* (2013.01); *H01L 21/2885* (2013.01); *H01L 21/32058* (2013.01); *H01L 21/32133* (2013.01); *H01L 21/76877* (2013.01); *H01L 21/76898* (2013.01); *H01L 23/481* (2013.01); *H01L 25/0657* (2013.01); *H01L 25/50* (2013.01); *H01L 24/08* (2013.01); *H01L 24/89* (2013.01);
(Continued)

(58) Field of Classification Search
CPC ........... H01L 21/2885; H01L 21/32058; H01L 21/32133; H01L 21/76877; H01L 21/76898; H01L 23/481; H01L 25/0657; H01L 25/50; H01L 24/08; H01L 24/89; H01L 2224/08146; H01L 2224/80203; H01L 2225/06541
USPC .............................................. 257/661; 438/2
See application file for complete search history.

(56) References Cited

U.S. PATENT DOCUMENTS 6,100,194 A    8/2000   Chan et al.
7,776,741 B2   8/2010   Reid et al.
(Continued)

FOREIGN PATENT DOCUMENTS

EP   1071126 A2   1/2001
EP   1415950 A2   6/2004

OTHER PUBLICATIONS

H. H. Chang et al., "TSV process using bottom-up Cu electroplating and its reliability test," Electronics System-Integration Technology Conference, 2008, pp. 645-650.
(Continued)

*Primary Examiner* — Didarul Mazumder
(74) *Attorney, Agent, or Firm* — Cantor Colburn LLP; Rabin Bhattacharya

(57) ABSTRACT

A semiconductor structure and methods of forming the semiconductor structure generally includes providing a thermocompression bonded superconducting metal layer sandwiched between a first silicon substrate and a second silicon substrate. The second substrate includes a plurality of through silicon vias to the thermocompression bonded superconducting metal layer. A second superconducting metal is electroplated into the through silicon vias using the thermocompression bonded superconducting metal layer as a bottom electrode during the electroplating process, wherein the filling is from the bottom upwards.

12 Claims, 4 Drawing Sheets

(51) Int. Cl.
*H01L 21/76* (2006.01)
*H01L 23/48* (2006.01)
*H01L 23/532* (2006.01)
*H01L 21/3205* (2006.01)
*H01L 21/3213* (2006.01)
*H01L 21/768* (2006.01)
*H01L 21/288* (2006.01)
*H01L 21/02* (2006.01)
*H01L 25/065* (2006.01)
*H01L 25/00* (2006.01)
*H01L 23/00* (2006.01)

(52) U.S. Cl.
CPC ............ *H01L 2224/08146* (2013.01); *H01L 2224/80203* (2013.01); *H01L 2225/06541* (2013.01)

(56) References Cited

U.S. PATENT DOCUMENTS

| | | | |
|---|---|---|---|
| 8,084,695 B2 | 12/2011 | Hsu et al. | |
| 8,951,808 B2 | 2/2015 | Ladinzinsky et al. | |
| 2009/0098731 A1* | 4/2009 | Gan | B81C 1/00095 438/667 |
| 2010/0164120 A1* | 7/2010 | Nakayama | H01L 21/486 257/774 |
| 2010/0240174 A1* | 9/2010 | Yu | H01L 21/76898 438/107 |
| 2011/0027987 A1 | 2/2011 | Takahashi et al. | |
| 2013/0093091 A1 | 4/2013 | Ma et al. | |
| 2014/0174794 A1* | 6/2014 | Kang | C25D 11/022 174/252 |
| 2014/0274725 A1* | 9/2014 | Abraham | H01L 39/223 505/170 |
| 2015/0091140 A1* | 4/2015 | Wen | B81C 1/00396 257/622 |
| 2015/0255330 A1* | 9/2015 | Lee | H01L 21/76843 438/653 |
| 2016/0109796 A1* | 4/2016 | Choung | G03F 1/38 430/5 |
| 2016/0276310 A1* | 9/2016 | Rajoo | H01L 25/0657 |

OTHER PUBLICATIONS

T. Satoh et al., "Improvement of fabrication process for 10-kA/cm 2 multi-layer Nb integrated circuits," IEEE Transactions on Applied Superconductivity, vol. 17, No. 2, 2007, pp. 169-172.

Y. Guan et al., "Mechanical and electrical reliability assessment of bump-less wafer-on-wafer integration with one-time bottom-up TSV filling," 65th Electronic Components and Technology Conference, 2015, pp. 816-821.

Invitation to Pay Additional Fees and, Where Applicable, Protest Fee, issued from the International Searching Authority in International Application No. PCT/EP2017/081792, dated Mar. 13, 2018; 14 pages.

David W. Abraham, et al., Pending U.S. Appl. No. 16/001,302, entitled "Superconducting Metal Through-Silicon-Vias," filed with the U.S. Patent and Trademark Office on Jun. 6, 2018.

List of IBM Patents or Patent Applications Treated as Related; (Appendix P), Date Filed Jun. 6, 2018; 2 pages.

* cited by examiner

SEMICONDUCTOR DEVICE INCLUDING SUPERCONDUCTING METAL THROUGH-SILICON-VIAS AND METHOD OF MANUFACTURING THE SAME

STATEMENT REGARDING FEDERALLY SPONSORED RESEARCH OR DEVELOPMENT

This invention was made with Government support under Contract No. H98230-13-D-0173 by the National Security Agency. The Government has certain rights to this invention.

BACKGROUND

The present invention generally relates to fabrication methods and resulting structures for semiconductor devices. More specifically, the present invention relates to the structure and formation of superconducting metal through silicon vias (TSV).

Generally, integrated circuits (ICs) include semiconductor devices formed as a configuration of circuits on a semiconductor substrate. A complex network of signal paths will normally be routed to connect the circuit elements distributed on the surface of the substrate. Efficient routing of these signals across the device requires formation of multilevel or multilayered conductive networks, which can be formed using schemes, such as, for example, single or dual damascene wiring structures. A TSV is a vertical electrical connection (via) passing completely through a silicon wafer or die. TSVs are a high performance interconnect techniques used as an alternative to wire-bond and flip chips to create 3D packages and 3D integrated circuits, compared to alternatives such as package-on-package, because the density of the vias is substantially higher, and because the length of the connections is shorter.

SUMMARY

Embodiments of the present invention are generally directed to semiconductor structures and methods for forming the semiconductor structures. A non-limiting example method of fabricating the semiconductor device according to embodiments of the invention includes patterning a layer of a first superconducting metal on a base substrate to form a first pattern of the superconducting metal and patterning a layer of a second superconducting metal on a cap substrate to form a second pattern of the superconducting metal. The second pattern of the second superconducting metal and the cap substrate are etched to form vias, wherein a remaining portion of the second superconducting metal extends about a perimeter of the via on a top surface of the cap substrate. The cap substrate is inverted and bonded to the base substrate. A portion of the cap substrate is removed to expose and provide openings to the vias, wherein a bottom of the vias expose the first pattern of first superconducting metal. The vias are filled with a third superconducting metal to form a through-substrate-via.

A non-limiting example method of fabricating a semiconductor device according to embodiments of the invention include patterning a layer of a first superconducting metal on a base substrate to form a first pattern of the superconducting metal. A layer of a second superconducting metal on a cap substrate is patterned to form a second pattern of the superconducting metal. The cap substrate is inverted and the first superconducting metal is bonded to the second superconducting metal. Vias are formed by etching the cap substrate to the bonded second superconducting metal, wherein a bottom of the vias exposes a surface of the second superconducting metal. The vias are filled with a third superconducting metal to form a through substrate via from the bottom up.

A non-limiting example semiconductor structure according to embodiments of the invention includes a thermocompression bonded superconducting metal layer sandwiched between a first silicon substrate and a second silicon substrate, wherein the second substrate includes a plurality of through-silicon-vias to the thermocompression bonded superconducting metal layer. The through-silicon-vias are filled with an electroplated superconducting metal.

A non-limiting example semiconductor structure according to embodiments of the invention includes a thermocompression bonded superconducting metal layer sandwiched between a first silicon substrate and a second silicon substrate, wherein the second substrate includes a plurality of through-silicon-vias to the thermocompression bonded superconducting metal layer.

A non-limiting example method for filling through-silicon-vias with a superconducting metal according to embodiments of the invention includes providing a thermocompression bonded superconducting metal layer sandwiched between a first silicon substrate and a second silicon substrate, wherein the second substrate includes a plurality of the through-silicon-vias to the thermocompression bonded superconducting metal layer. A second superconducting metal is electroplated into the through-silicon-vias using the thermocompression bonded superconducting metal layer as a bottom electrode during the electroplating process, wherein the filling is from the bottom upwards.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
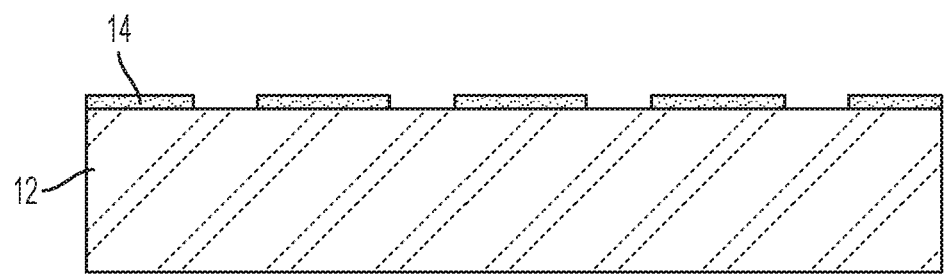
FIG. 1 is a top down view depicting a semiconductor device after a fabrication operation according to embodiments of the invention.

TSVs are used as interconnects through bulk silicon wafers to reduce interconnect lengths and for three dimensional stacking. Metals previously used to fill the TSVs included tungsten and copper, which can be deposited by chemical vapor deposition and electroplating, respectively. By way of example, copper can be electroplated using a conductive seed layer such as plasma vapor deposited (PVD) copper that is conformal to the via and the wafer surface.

There are generally two approaches to electroplating copper, both of which require special copper plating solutions. In one approach, conformal plating deposits copper at an equal rate over the entire whole surface but has an increased probability of void formation whereas, in another approach, a bottoms-up plating process deposits copper from the bottom of the via to form a void free fill. An alternative approach to bottoms up plating that does not require a special copper plating solution is to provide a seed layer at the bottom surface defining the via such that the copper selectively grows from the "bottom up" to fill the via.

Though tungsten and copper have low resistivity, neither metal is superconducting at a reasonable temperature, i.e., temperatures greater than 1000° K. A superconducting metal can be desirable for some applications such as Rapid Single Flux Quantum (RSFQ) circuitry. RSFQ circuitry uses superconducting devices, namely Josephson junctions, to process digital signals. In RSFQ logic, information is stored in the form of magnetic flux quanta and transferred in the form of Single Flux Quantum (SFQ) voltage pulses. RSFQ is one family of superconducting or SFQ logic. Others include Reciprocal Quantum Logic (RQL), ERSFQ energy-efficient RSFQ version that does not use bias resistors, or the like. Josephson junctions are the active elements for RSFQ electronics, just as transistors are the active elements for semiconductor electronics. The present invention is generally directed to a bottoms-up electroplating process for depositing a superconducting metal in a TSV.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

Exemplary embodiments of the invention will now be discussed in further detail with regard to semiconductor devices and methods of manufacturing the same and, in particular, to a bottom-up electroplating process for depositing a superconducting metal in a through-substrate-via (TSV) to provide a superconducting void-free interconnect. The TSV superconducting structures are suitable for RFSQ circuitry, for example.

Turning now to FIGS. 1-5, there is shown a process in accordance with one or more embodiments of forming a bottoms-up superconducting TSV. In FIG. 1, there is depicted a base substrate 12, e.g., a silicon wafer. In one or more embodiments, a thin layer of a superconducting metal 14 is blanket deposited at a thickness of about 10 nanometers (nm) to about 5 microns (μm) onto the base substrate 12. In one or more other embodiments, the superconducting metal is deposited at a thickness of about 10 nm to about 1000 nm, and in still other embodiments, the superconducting metal is deposited at a thickness of about 20 nm to about 500 nm. The superconducting metal can be aluminum, gallium, indium, lanthanum, molybdenum, niobium, rhenium, ruthenium, tin, tantalum, titanium, zinc, zirconium, alloys thereof, and the like. The superconducting metal generally in addition to being superconducting, functions in a manner similar to a seed layer typically used in copper electroplating processes as will be discussed in greater detail below.

The thin layer of superconducting metal 14 can be deposited onto the base substrate 12 without previous treatment by evaporation, sputtering or by electroplating. In some cases the substrate can be cleaned prior to deposition of superconducting metal 14, and in addition a relatively thin adhesion layer (e.g., a thickness of 2 nm to 20 nm) such as titanium or tantalum can be deposited prior to layer 14. The layer of superconducting metal 14 is then lithographically patterned, which can include forming a photoresist (e.g., organic, inorganic or hybrid) atop the layer of the superconducting metal 14. The photoresist can be formed utilizing a deposition process such as, for example, CVD, PECVD, spin-on coating or the like. Following formation of the photoresist, the photoresist is exposed to a desired pattern of radiation. Next, the exposed photoresist is developed utilizing a conventional resist development process. After the development step, a selective etching step can be performed to transfer the pattern from the patterned photoresist into at the layer of superconducting metal 14 stopping at the silicon layer. The etching step used in forming the patterned superconducting metal 14 can include a dry etching process (including, for example, reactive ion etching, ion beam etching, plasma etching or laser ablation), a wet chemical etching process or any combination thereof.

Figure 2:
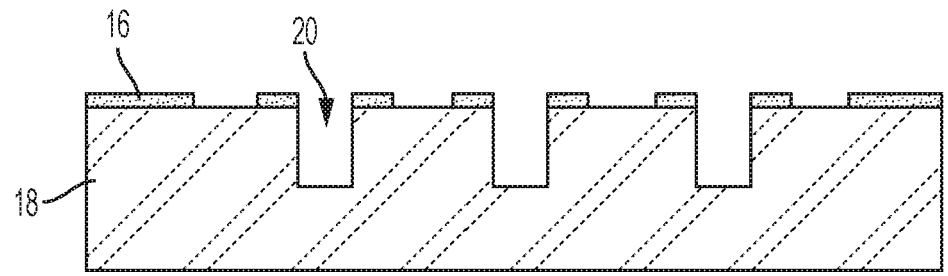
FIG. 2 is a sectional view depicting a semiconductor device after a fabrication operation according to embodiments of the invention.

In FIG. 2, there is depicted a cap substrate 18. A layer of superconducting metal layer 16 is deposited onto a cap substrate 18. The superconducting metal 16 can be the same as the superconducting metal 14 formed on the base substrate 12. For example, the layers of superconducting metals 14, 16 can be formed of aluminum. The cap substrate 18 can be of the same material as the base substrate 12, e.g., a silicon wafer.

The superconducting metal 16 can be deposited at the same or different thickness as superconducting layer 14. Generally, superconducting metal 16 can be blanket deposited onto the cap substrate 18 at a thickness of about 10 nanometers (nm) to about 5 microns (μm). In one or more other embodiments, the superconducting metal is deposited at a thickness of about 10 nm to about 1000 nm, and in still other embodiments, the superconducting metal is deposited at a thickness of about 20 nm to about 500 nm. The superconducting metals 14, 16 can be dissimilar or similar depending on the desired application.

The layer of superconducting metal 16 is then lithographically patterned in the manner described above. Vias 20 are then formed in the cap substrate 18 by lithographically patterning and anisotropically etching the silicon substrate. As will be apparent, the vias 20 will be utilized to define the TSVs and extend partly through the cap substrate 18. For example, the vias can extend to a depth of about 10 microns (μm) to as much as about 350 μm depending on the initial thickness into the silicon substrate, which typically have a thickness generally depending on diameter of about 275 μm to about 775 μm. In other embodiments, the via depth into the cap substrate 18 is about 10 μm to about 250 μm, and in still other embodiments, the via depth into the cap substrate 18 is at about 20 μm to about 150 μm. By way of example, the silicon substrate can be subjected to wet or dry etching to form the vias.

The resulting pattern of the superconducting metal 16 and vias 20 in the cap substrate 18 are such that a portion of the superconducting material 16 surrounds a perimeter top surface about the via 20.

Figure 3:
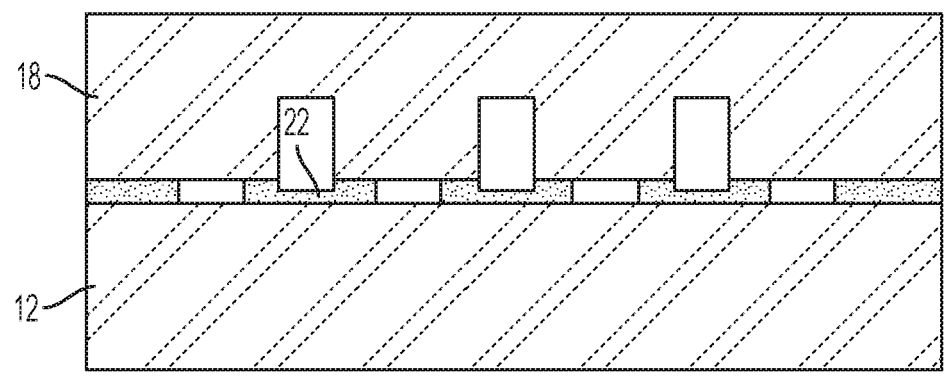
FIG. 3 is a sectional view depicting a semiconductor device after a fabrication operation according to embodiments of the invention.

In FIG. 3, the cap substrate 18 including the patterned superconducting metal 16 and vias 20 thereon is then inverted and bonded to the base substrate 12 such as by thermocompression bonding, also referred to as diffusion bonding. The surrounding portions of the superconducting metal 16 in the cap substrate are mated to the corresponding patterned superconducting metal 14 on the base substrate 12. That is, the portion of the superconducting material 16 surrounding the perimeter top surface of the vias 20 contacts the corresponding patterned superconducting metal 14 on the base substrate 12. In this manner, the superconducting metals 14, 16 on each substrate 12, 18 can be brought together into atomic contact by applying force and heat simultaneously to bond the cap substrate 18 to the base substrate 12 as shown. The resulting structure includes the surrounding portion of superconducting metal 16 about the perimeter from the cap substrate 18 is bonded to a corresponding portion of the superconducting metal 14 in the base substrate 12 whereas the inverted vias 20 include a superconducting metal layer (from the base substrate 12) at the bottom 22 of each via 20.

As an example of thermocompression bonding, aluminum on one substrate can be bonded to aluminum on another substrate by subjected the substrates to a bonding temperature from about 400° C. to about 450° C. with an applied force above 70 kN for 20 to 45 min, although higher or lower temperatures and forces can be used for different superconducting metals.

Figure 4:
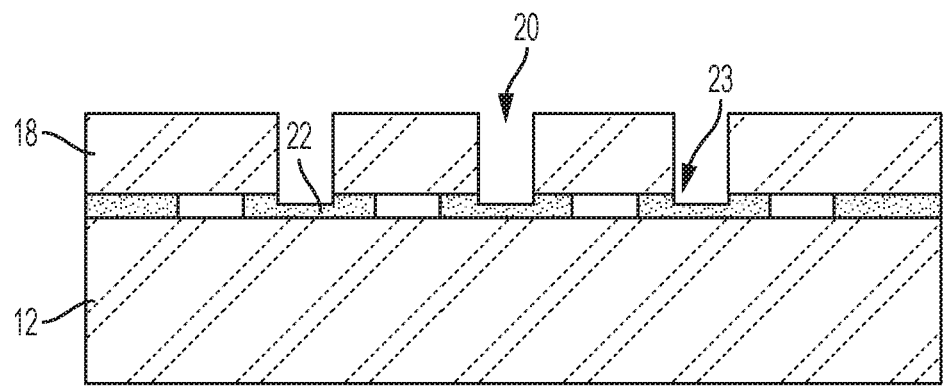
FIG. 4 is a sectional view depicting a semiconductor device after a fabrication operation according to embodiments of the invention.

In FIG. 4, the cap substrate 18 is subjected to a wafer backgrinding process to remove a portion of the cap substrate so as to expose and open the vias 20, wherein a bottom 23 of the vias 20 expose the first pattern of the first superconducting metal 22. The backgrinding process generally includes application of a slurry of coarse particles to coarsely grind the wafer and remove a bulk of the wafer thickness. A finer grit is then used to polish the wafer. The coarse grinding can be used to remove about 90 percent of the substrate.

The superconducting metal surface 22 at the bottom of the vias 20 is cleaned to remove any oxide thereon. Cleaning can include applying an etchant configured to selectively remove the oxide and any residual slurry contaminants from the backgrinding process. Depending on the choice of superconducting metal utilized to form the superconducting layer 14 on the base substrate 12, the superconducting metal surface at the via bottom 22 can be prepped for filling by an optional electroless plating. For example, a superconducting metal such as zinc or tin can be electrolessly plated onto an aluminum layer, which can promote adhesion of the fill material during a subsequent electroplating process. Aluminum, by itself, is a very difficult substrate to directly plate thereon.

Figure 5:
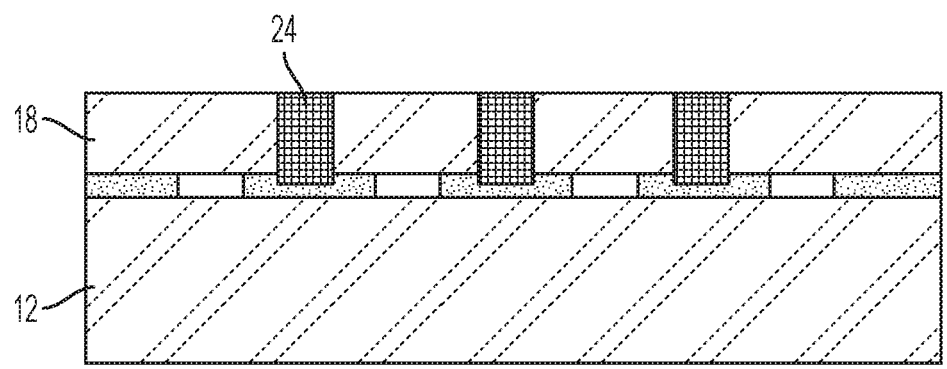
FIG. 5 is a sectional view depicting a semiconductor device after a fabrication operation according to embodiments of the invention.

In FIG. 5, the vias 20 are filled with a superconducting metal or metal alloy to form the TSV 24 by subjecting the substrate to an electroplating process by making electrical contact to the backside of the base substrate 14 and immersing the substrate into an electrolyte bath. The superconducting metal or metal alloy grows from the bottom up until the TSV is fully filled with the superconducting metal and ready for further processing. As such, the previously deposited superconducting metals of layers 14, 16 function as a bottom electrode during the electroplating process The electrolyte bath can be made up of electrolyte solvent and one or more salts including a source of metal or metals to be electroplated. Often salts can also be present to improve conductivity and efficiency of the process. The solvent can be aprotic or at least very weakly acidic. In addition, the solvent should be such as to dissolve reasonable amounts of metal salts (sources of the metal being plated) and other salts to increase electrolyte conductivity. In addition, the solvent should be stable not only to the substrate material being electroplated but under the condition of electroplating the metal.

A large variety of solvents can be used in the practice of the invention. Typically, the non-aqueous solvent is chosen from various stable organic liquids such as nitriles, carbonates, amides, ketones, alcohols, glycols, ethers, and the like. Typical solvents are acetonitrile, benzonitrile, diglyme (diethylene glycol dimethyl ether), triglyme (triethylene glycol dimethyl ether), tetraglyme (tetraethylene glycol dimethyl ether), ethylene glycol, dimethyl formamide, acetamide, acetone, methyl isobutyl ketone, tetrahydrofuran, dimethylsulfoxide, propylene and ethylene carbonates. In one or more embodiments, the solvent can be acetonitrile, propylene carbonate or methanol. Mixtures of the above solvents can be used as well as other substances that are stable, suitable for use in an electroplating process and not reactive to the material being electroplated. More acidic solvents can be used (even water) provided that the potential required to plate the metal protects the material being electroplated from reaction with water.

A large variety of superconducting metals and alloys can be plated using the inventive procedure. For example, the superconducting metals can be copper, tin, silver, lead, zinc, cadmium, indium, nickel, alloys thereof, and combinations of these metals. In one or more embodiments, metals such as indium, tin, lead and tin-lead alloys are utilized because of ease of plating, availability, high electrical and thermal conductivity. Throughout this application the word metal should be understood to include various superconducting alloys (e.g., tin-lead alloy) and mixtures of metals as well as pure elemental metal.

The metals are introduced into the electroplating bath usually in the form of a salt, preferably a salt soluble in the electrolyte solvent and with an anion which is stable under conditions of the electroplating process. Typical anions are nitrate, perchlorate, halide (especially chloride, bromide and iodide), tetrafluoroborate, hexafluoroarsenate. Typically, perchlorates and nitrates are used because of availability and solubility in nonaqueous solvents.

Generally, concentrations vary from about 0.001 Molar to saturation. Too low a concentration requires too much time to electroplate and too much replenishment during processing. Typically, concentrations are adjusted to maximize conductivity when combined with certain ionic (conducting) salts.

The bath is typically made up of non-aqueous solvent described above, an electrochemically stable metal salt of the metal being plated (e.g., nitrate, perchlorate) and optionally a stable salt to increase ionic conductivity. A wide concentration range can be used including from trace amounts (0.001 Molar) to saturation. In one or more embodiments, concentrations are usually close to saturation, for example from about $\frac{1}{10}$ the concentration of a saturated solution to the concentration of a saturated solution. By way of example, concentrations from 0.1 of saturated solutions to the concentration of the saturated solution can be used.

In addition to non-aqueous solvent described above and metal salt described above, the bath can contain conducting salts to increase the conductivity of the bath. These conducting salts are typically alkali-metal salts with stable anions with good solubility in the non-aqueous solvents. Typical anions are the same as for the metal salts given above (nitrate, perchlorate, halides, tetrafluoroborate (e.g. sodium tetrafluoroborate) and hexafluoroaresenate (e.g., lithium hexafluroarsenate). Also useful are the tetra alkylammonium salts such as tetrabutylammonium halides and tetraethyl ammonium halides. Concentrations of the conducting salts can vary from 0.001 molar to saturation and are usually determined so as to maximize conductivity of the bath. Generally, concentrations near saturation (within 0.1 of saturation to saturation) are preferred.

The electroplating process is carried out in a conventional manner with a conventional anode and the material to be plated made the cathode of an electroplating apparatus.

Figure 6:
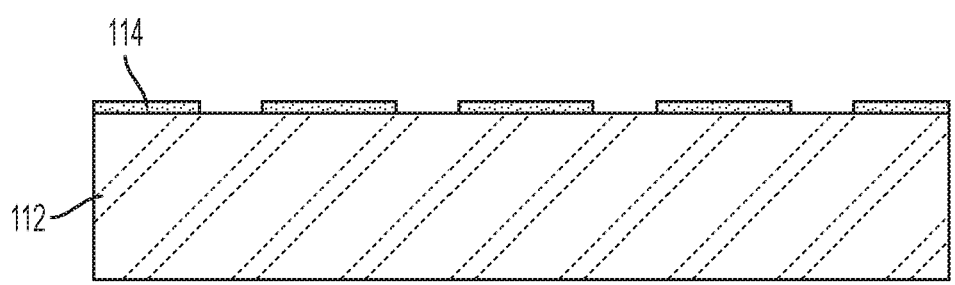
FIG. 6 is a sectional view depicting a semiconductor device after a fabrication operation according to embodiments of the invention.

In one or more other embodiments, the process for forming the superconducting TSVs is shown in FIGS. 6-10. In FIG. 6, a base substrate 112 is provided, e.g., a silicon wafer. A thin layer of a superconducting metal 114 is blanket deposited at a thickness of about 10 nanometers (nm) to about 5 microns (μm). In one or more other embodiments, the superconducting metal is deposited at a thickness of about 10 nm to about 1000 nm, and in still other embodiments, the superconducting metal is deposited at a thickness of about 20 nm to about 500 nm. The superconducting metal can be a metal as previously described. The layer of superconducting metal 114 is then lithographically patterned to form a patterned superconducting metal as shown.

Figure 7:
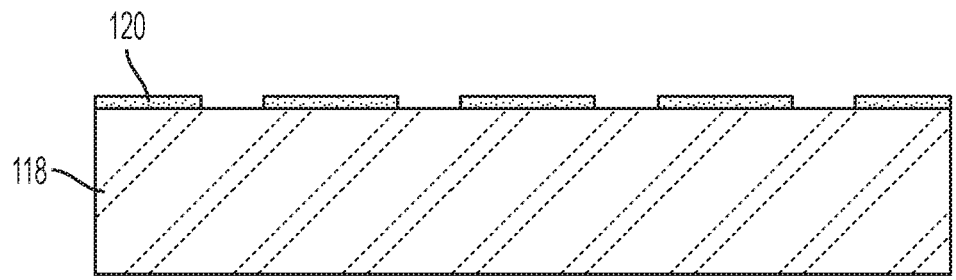
FIG. 7 is a sectional view depicting a semiconductor device after a fabrication operation according to embodiments of the invention.

In FIG. 7, a cap substrate 118 is provided and thin layer of a superconducting metal 120 is blanket deposited at a thickness of about 10 nanometers (nm) to about 5 microns (μm). In one or more other embodiments, the superconducting metal is deposited at a thickness of about 10 nm to about 1000 nm, and in still other embodiments, the superconducting metal is deposited at a thickness of about 20 nm to about 500 nm. The superconducting metal can be a metal as previously described. The layer of superconducting metal 120 is then lithographically patterned to form a patterned superconducting metal similar to that provided in FIG. 6.

Figure 8:
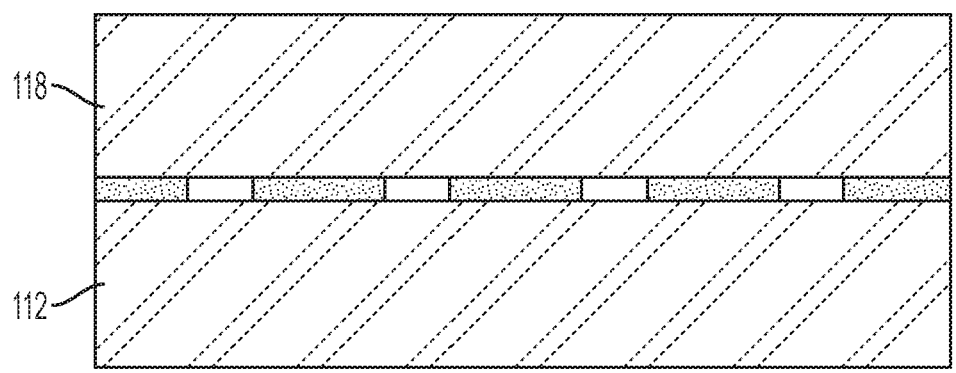
FIG. 8 is a sectional view depicting a semiconductor device after a fabrication operation according to embodiments of the invention.

In FIG. 8, the cap substrate 118 is inverted and the patterned superconductor layer 120 is aligned with the corresponding patterned superconducting metal 114 on the base substrate 112 and subjected to thermocompression bonding to bond the cap substrate 118 to the base substrate 112.

Figure 9:
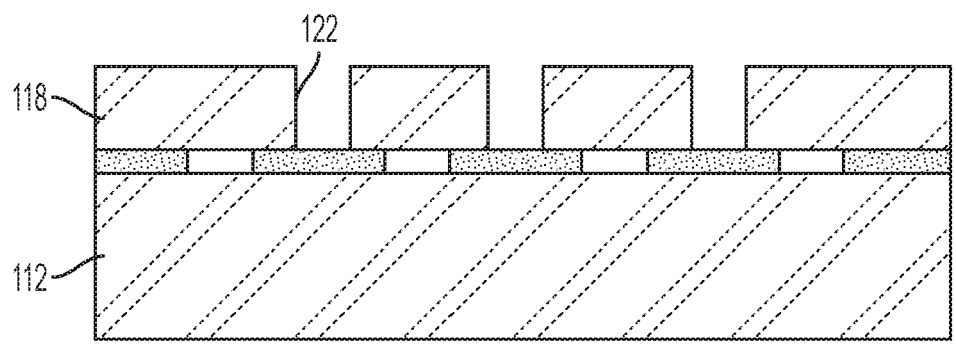
FIG. 9 is a sectional view depicting a semiconductor device after a fabrication operation according to embodiments of the invention.

In FIG. 9, the cap substrate 118 is subjected to backgrinding process as described above to remove a portion of the cap substrate. The remaining thickness of the cap substrate 118 will be used to define the length of the TSV. The cap substrate 118 is then lithographically patterned and etched to form vias 122 therein, which are configured to land on the thermocompression bonded and patterned superconducting metals 114/120. The topmost exposed superconducting metal 120 is then cleaned and prepped if needed by electrolessly prepped as previously described using a superconductor such as zinc or tin to promote adhesion during the fill process.

Figure 10:
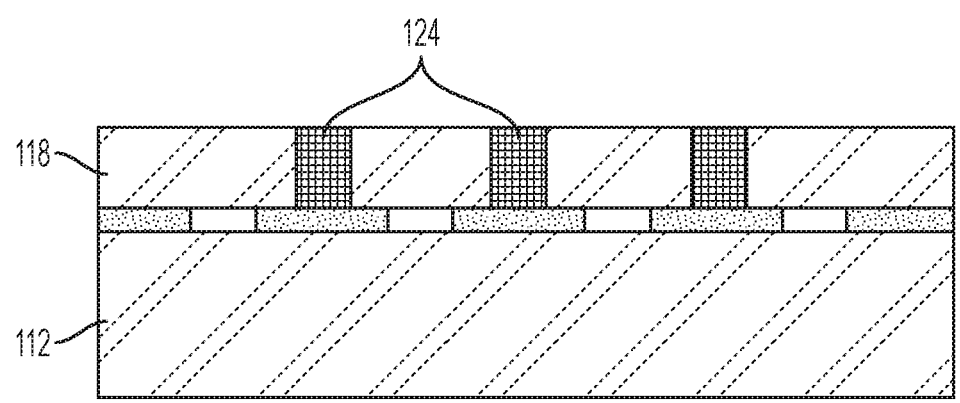
FIG. 10 is a sectional view depicting a semiconductor device after a fabrication operation according to embodiments of the invention.

In FIG. 10, electrical contact is made to the backside of the base substrate 112 and the substrate is immersed in an electroplating bath to fill the so-formed vias, thereby forming the TSVs 124 filled with a superconducting metal or metal alloys. The superconducting metal or metal alloys is formed from the bottom of the via up.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:

patterning a layer of a first superconducting metal on a base substrate to form a first pattern of the first superconducting metal;

patterning a layer of a second superconducting metal on a cap substrate to form a second pattern of the second superconducting metal;

etching the second pattern of the second superconducting metal and the cap substrate to form vias, wherein a remaining portion of the second superconducting metal extends about a perimeter of the via on a top surface of the cap substrate such that the vias remain open after the etching;

inverting the cap substrate and bonding the cap substrate to the base substrate;

removing a portion of the cap substrate to expose and provide openings to the vias, wherein a bottom of the vias expose the first pattern of first superconducting metal; and filling the vias with a third superconducting metal to form a through-substrate-vias from bottom of the through-substrate-vias upwards to completely fill the through-substrate-vias in one step.

2. The method of claim 1, wherein bonding the cap substrate to the base substrate comprises aligning and thermocompressively contacting a portion of the second superconducting metal on the cap substrate to the first superconducting metal on the base substrate.

3. The method of claim 1, wherein filling the vias with the third superconducting metal comprises electroplating.

4. The method of claim 1, wherein filling the vias with the third superconducting metal comprises cleaning the first pattern of the first superconducting metal at the bottom of the vias to remove oxides and contaminants thereon followed by electroplating.

5. The method of claim 1, wherein filling the vias with the third superconducting metal comprises cleaning the first pattern of the first superconducting metal at the bottom of the via to remove oxides and contaminants thereon; electrolessly depositing a fourth superconducting metal onto the first pattern of the first superconducting metal at the bottom of the via; and electroplating the third superconducting metal therein to fill the vias from the bottom up.

6. The method of claim 1, wherein the base substrate and the cap substrate comprise silicon wafers.

7. The method of claim 1, wherein removing the portion of the cap substrate provides the vias with a depth of about 10 µm to about 250 µm.

8. The method of claim 1, wherein removing the portion of the cap substrate to expose and provide the openings to the vias comprises a backgrinding process.

9. The method of claim 1, wherein the first and second superconducting metals are the same.

10. The method of claim 1, wherein the third superconducting metal is different from the first and second superconducting metals.

11. A method for filling through-silicon-vias with a superconducting metal, the method comprising:
   providing a thermocompression bonded superconducting metal layer sandwiched between a first silicon substrate and a second silicon substrate, wherein the second substrate comprises a plurality of the through-silicon-vias attached to the thermocompression bonded superconducting metal layer; and
   electroplating superconducting metal into the plurality of the through-silicon-vias using the thermocompression bonded superconducting metal layer as a bottom electrode during the electroplating, wherein filling the plurality of the through-silicon-vias from the bottom of the plurality of the through-silicon-vias upwards to completely fill the plurality of the through-silicon-vias in one step.

12. The method of claim 11, wherein the thermocompression bonded superconducting metal layer comprises aluminum, lead, or alloys thereof and the superconducting metal filling comprises indium, tin, or alloys thereof.

* * * * *